United States Patent [19]

Iwasa

[11] Patent Number: 4,658,960
[45] Date of Patent: Apr. 21, 1987

[54] COLOR CODING CASSETTE

[76] Inventor: Nob T. Iwasa, P.O. Box 3526, San Luis Obispo, Calif. 93403

[21] Appl. No.: 785,248

[22] Filed: Oct. 7, 1985

[51] Int. Cl.$^4$ .......................... B65D 1/34; B65D 85/30
[52] U.S. Cl. ..................................... 206/459; 206/334; 206/456; 118/500; 40/491; 40/5; 40/18
[58] Field of Search .............. 206/459, 305, 334, 534, 206/439, 453, 456; 40/5, 18, 491; 118/500

[56] References Cited

U.S. PATENT DOCUMENTS

| | | | |
|---|---|---|---|
| 302,695 | 7/1884 | Wayer | 40/491 |
| 1,528,500 | 3/1925 | Montamat | 206/459 |
| 1,773,670 | 8/1930 | Girlich | 40/491 |
| 1,919,382 | 7/1933 | Sherwood | 40/5 |
| 3,377,983 | 4/1968 | Gordon-Cooper | 40/491 |
| 3,926,305 | 12/1975 | Wallestad | 206/334 |
| 3,961,877 | 6/1976 | Johnson | 206/454 |
| 4,365,566 | 12/1982 | Laidig | 40/491 |
| 4,566,539 | 1/1986 | Butler | 206/454 |

FOREIGN PATENT DOCUMENTS

| | | | |
|---|---|---|---|
| 1058566 | 7/1979 | Canada | 206/438 |
| 1070665 | 6/1967 | United Kingdom | 206/459 |

Primary Examiner—William Price
Assistant Examiner—Brenda J. Ehrhardt

[57] ABSTRACT

In the fabrication process of the integrated circuit manufacturing there used to be an inconvenience in handling the many of the cassette of the wafers. By using the color coded cassette of the present invention the personnel can distinguish and identify the correct status of the wafers in the cassette in the fabrication process. The personnel can sort and transport the wafers in the cassette depending on the status of the process shown in the color code. The color coding cassette of the present invention employs several colors for coding on the side of the cassette. The change and display of the proper color code are operated by the handy knobs attached to each color coding piece. The colors are differently painted from every other color to distinguish itself from every other code. They are green, white, yellow and red, for example. This color coding technology can be embodied by injection moulding of the plastic. It cost less expenditure. The valuable utilization can be found in the integrated circuit fabrication in the manufacturing and in the research and development.

15 Claims, 2 Drawing Figures

COLOR CODING CASSETTE

BACKGROUND OF INVENTION

The present invention generally relates to the special receptacle or package and specifically the handling media means; cassette, carrier, basket, tray for handling the electrical/electronics materials in the process of the fabrication.

Moving wafers materials, in the semiconductor industry, safely and speedily during the integrated circuits fabrication is important. Today most of the transportation processes of the devices are done by the cassette which holds commonly 25 wafers. After the wafers have been processed at the one processing equipment, a worker carriers the output cassette to the next station for the next process. (The cassette to cassette flow in the transportation reduces the contamination, damage and breakage of the wafers.) However, the conventional cassette has no means to distinguish the status in the process for the wafers which it holds.

The color coding cassette of the present invention is dealing with the semiconductor materials transport circumstances. There is a need for a new type of cassette to improve the fabrication process and to open the new dimension in the wafer transport. The following are the typical circumstances in the semiconductor industries: (1) During the breakdown period of the automatic processing system, i.e., systems equipped with in-line wafer transport, the color coding cassette of the present invention substitutes the automatic materials handling equipment. (2) The high technology products require periodic process changes and the semiautomated cassette to cassette approach for transferring the materials, i.e., individual process module, is more suitable. The color coding cassette of the present invention can be utilized in the variety of applications. (See summary of invention.) (3) The automatic materials transport as the bus to transport many of the cassettes of materials among the processing areas in the fabrication, for example the Auto-Carrier, being used by the Mitsubishi Electric, the color coded cassette is very useful in handling, sorting, delivering the correct cassette to the correct processing area. (4) The automatic wafer transport such as the modular transport system made by Varian Associates, where the modules are interconnected to provide a network of the processing rooms for transporting the cassettes. The color coding technology on the cassette with the application of computer to automate the wafer transportation system is useful and important. No other prior development in the field of wafer transport has been done.

SUMMARY OF INVENTION

The present invention that employs the color coding technology on the cassette to distinguish the status of the electrical/electronics materials in the particular process from other materials in the different process.

In the semiconductor devices fabrication, this cassette of the present invention (1) for the individual process module, reduces the time and labour which is required by the worker for transferring the wafers from one station to another station during the processing and, (2) for the automatic wafer transports, particularly makes it easy for the carrier to transport many of the wafers speedily and with no error from one station of one processing area to another station of a different processing area.

The color coding cassette having the color coding technology of the present invention can be made at low cost, by means of injection moulding of the plastic, which does not require the high technology.

The color coding cassette can be called in the variety of circumstances in combination with the specific circumstances and/or associated with the computer or other systems. The color coding cassette cost is compatible to the non-color coded cassette to be manufactured. The color coding cassette has the following significant advantages over the non-color coded cassette.

1. In the processing room, which is composed of individual modular stations, the color coding cassette of the present invention eliminates the restriction of the non-color coded cassette, of that the transfer of the process status information only to the nearest modular station by the memory of the carrier. In other words, the color coding cassette of the present invention can transfer the status information which is coded by color on the cassette to any modular station of any process from any modular station of any process.
2. In the processing room, composed of the wafer transport, which is mechanically linked with the various modules, when the machine is down, the color coding cassette of the present invention substitutes the automatic transport process.
3. In the facility, equipped with the automatic wafer transfer system, the color coding cassette of the present invention saves the time and labour in sorting and delivering and addressing the many of the cassette. (See background of invention, paragraphs 3 and 4.)

The color coding cassette of the present invention eliminates the previous restrictions that existed in the transportation process of the cassette of wafers. It is (1) the sequence of, and (2) the ordering the handling steps in the transferring the wafers among the various stations of the different processing area and opening the new dimension in the manufacturer.

Design of the facility has more freedom in laying out the fabrication process. The clearly predicted advantages by using the color coding cassette are that:

(1) the distance between the stations of the processing area and the location of the processing equipments and the complexity of the transfer route are no longer the matter; and
(2) the wafers in the color coded cassette can be transferred and sorted to the right address from the right address speedily and with no error.

The new dimension in designing the production facility is so that it has flexibility in scheduling the production. The clearly predicted advantages by using the color coding cassette are that:

(1) to change the transportation route of the wafers, depending on the productivity or due to other circumstances among the different processing areas, becomes easy; and
(2) it is very easy to utilize the old equipment in addition to the new equipment that is located at the far distance or at different location.

The color coding cassette opens the new capability of inventory control, by using the color coding cassette in conjunction with color sensing devices, and with or without a computer. The color coding cassette opens the new capability of monitoring the fabrication by using the color coding cassette in conjunction with color sensing apparatus, and with monitoring computer.

The color coding cassette opens the new capability of automating the transport and other handling process by using the color coding cassette in conjunction with color sensing apparatus and with the computer.

DESCRIPTION OF THE PREFERRED EMBODIMENT

Figure 1:
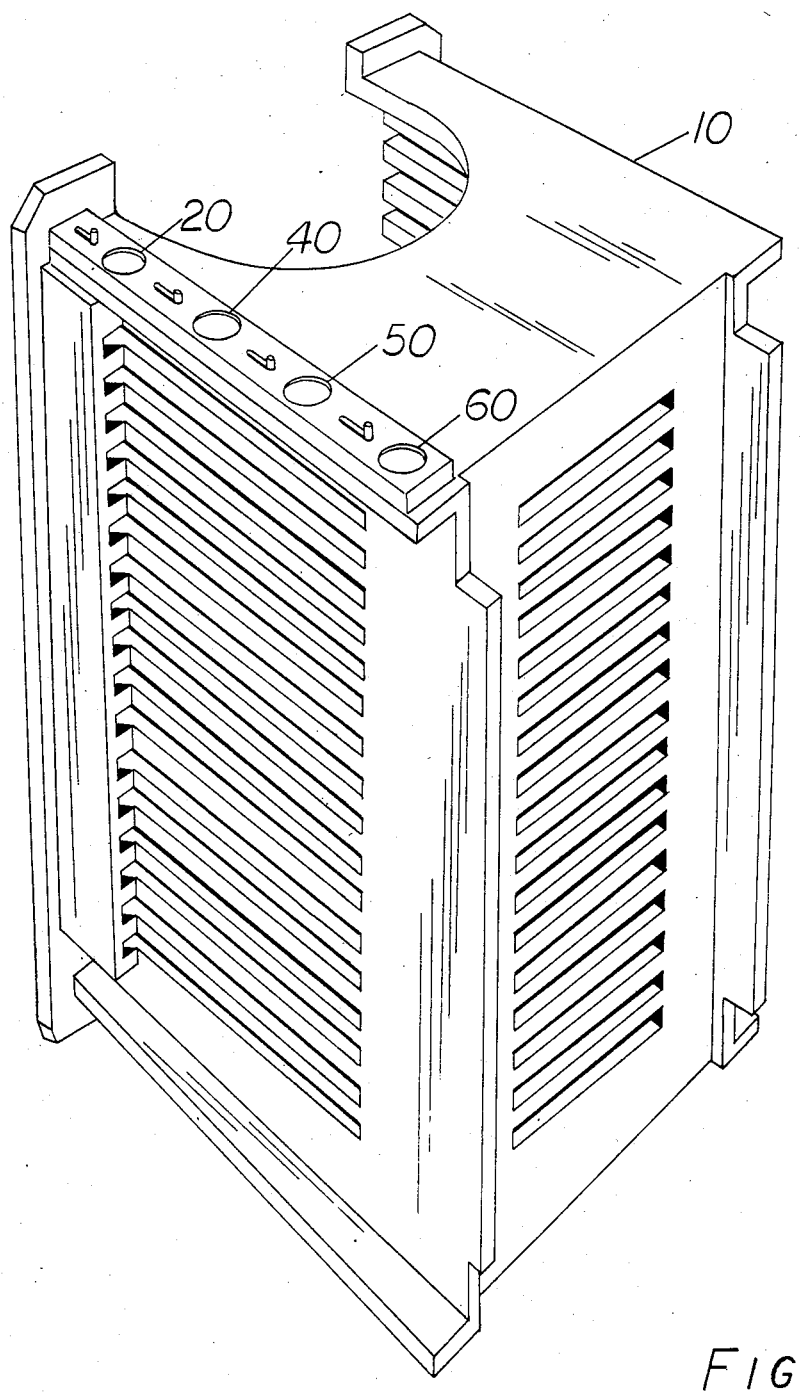
FIG. 1. The sketch of the wafer cassette.

The color codable cassette of the present invention is shown in FIG. 1. The color coding technique is shown as 20, 40, 50 and 60 in FIG. 1. The cassette 10 in FIG. 1 holds about 25 wafers for transporting them among the processing areas. But the cassette itself is not the present invention.

Figure 2:
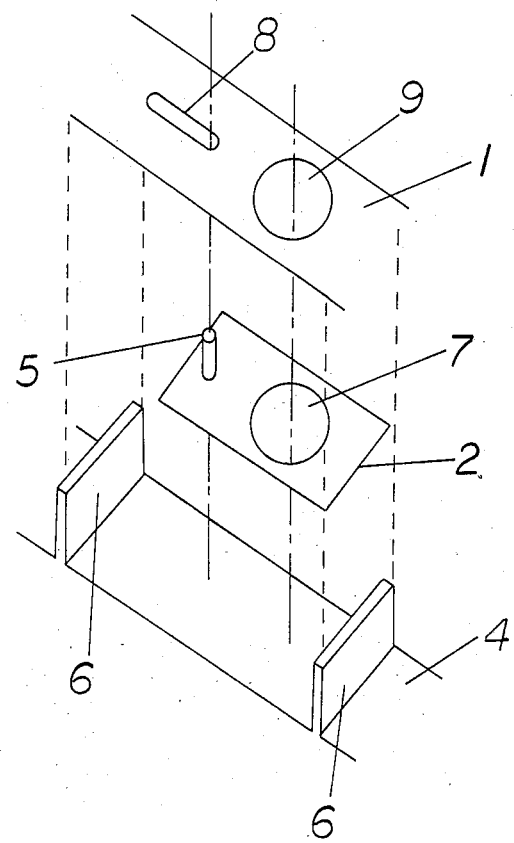
FIG. 2. The details of the color coding technology on the cassette.

The details of the color coding technology on the cassette are shown in FIG. 2. The outer cover is 1. The inner piece is 2. The base is 4. The knob to show the color code is 5. The stops for the inner piece is 6. The color code mark is 7. The open window for the knob is 8. The open window for the color code is 9.

The typical method of making the color coding technology is injection moulding of the plastic. The inner piece may be embodied in the manufacturing by means of plastic or metal. The color code 7 in FIG. 2 may be painted on the inner piece 2 in FIG. 2. The color combination for the 20, 40, 50, and 60 in FIG. 1 may be custom designed so that it best suits the customer's manufacturing circumstance. For example, it may be green, white, yellow and red.

Utilization of the color coding cassette in the manufacturing or research and development facilities Case 1: Individual Status Coding The assignment of the color code on the cassette may be made, for example, in the following. The first color code 20 is green, that means the finishing status of the lithographic process. The second color code 40 in FIG. 1 in white, that means the finishing status of the resist process. The third color code 50 in FIG. 1 is yellow, that means the finishing status of diffusion process. The fourth color code 60 in FIG. 1 is red, that means the finishing status of ion-implantation process. Those cassettes may be carried from one processing area to another processing area by means of conveyors, transportation system or carriers. Since the color code clearly shows the address of the sender (and also virtually the next predetermined receiver-station), the carrier should not have the confusion of mixing the different cassettes.

Case 2: Cyclic Status Coding

The assignment of the color code may be made for another example, in the following. The first color code 20 in FIG. 1 is green, that means the first-cycle status of the cycle: lithography process-resist process-etch process-diffusion process/ion-implantation process-deposition process-back to lithography process.

The second color code 40 in FIG. 1 is white, that means the second-cycle status of the cycle: lithography process-resist process-etch process-diffusion process-/ion-implantation process-deposition process-back to the third lithography process.

The third color code 50 in FIG. 1 is yellow, that means that third-cycle status of the cycle: lithography process-resist process-etch process-diffusion process-/ion-implantation process-deposition process-back to the fourth lithography process.

The fourth color code 60 in FIG. 1 is red, that means the fourth-cycle status of the cycle: lithography process-resist process-etch process-diffusion process/ion-implantation process-deposition process.

Operating the color coding cassette

When the operator intends to show the specific status for the cassette, the operator pushes forward the knob 5 in FIG. 2 to display the specific color code 7 in FIG. 2 through the window 9. On the other hand, when the operator intends to take out the specific color code in order to change the status, for example, the operator pushes back the knob attached to the specific color code close in the color display 7.

I claim:

1. A device for
indicating the stage in the processing of the electronic materials,
or indicating the class for processing the electronic materials,
or indicating the class of the result after processing the electronic materials,
or indicating the designation of the step or steps in processing the electronic materials,
or indicating the area in fabricating the electronic materials,
or indicating the line in fabricating the electronic materials,
said device including a carrier designed to hold such materials and indicating means located on the said carrier,
said indicating means comprising:
a. one or more indicator plates, each having an upstanding knob for moving the plate and a colored area adapted
to signal the completion of one or more steps in the processing of the materials in the carrier,
or to signal the classification for processing the materials in the carrier,
or to signal the classification of the result after processing the materials in the carrier,
or to signal the designation of the step or steps in the processing of the materials in the carrier,
or to signal the area identification in fabricating the materials in the carrier,
or to signal the line identification in fabricating the materials in the carrier; and
b. cover plate corresponding to and overlying such indicator plate, each cover plate comprising;
1. a first opening of an elongated shape overlying the knob of the indicator plate and adapted to allow the plate
to be moved from a non-completion indicating position to a completion indicating position,
or to be moved from classification not-indicating position to a classification indicating position,
or to be moved from designation not-indicating position to a designation indicating position,
or to be moved from identification not-indicating position to a identification indicating position, and back, and
2. a second opening adapted to overlie the colored portion of the indicator plate
in either its completion indicating or non-completion indicating position, or in either its class indicating or class not-indicating position, or in either its designation indicating or designation not-indicating position, or in either its area identification indicating or area identification not-indicating position, or in either its line identification indicating or line identification not-indicating position;

wherein each indicator plate may be moved from the non-completion indicating position to the completion indicating position, or from classification not-indicating position to the classification indicating position, or from designation not-indicating position to the designation indicating position, or from area identification not-indicating position to the area identification indicating position, or from line identification not-indicating position to the area identification indicating position, when the processing step or steps which correspond to each colored indicator is completed, or the class which correspond to each colored indicator is adopted, or the designation which correspond to each colored indicator is adopted, or area identification which correspond to each colored indicator is adopted, or line identification which correspond to each colored indicator is adopted, and indicator plate may be returned to the non-completion indicating position, or to class not-indicating position, or to designation not-indicating position, or to the area identification not-indicating position, or to the line identification not-indicating position, in preparation for a reuse of the carrier for another group of electronic materials, or for a reuse of the carrier for another processing step or steps, or for a reuse of the carrier for another fabrication area or areas, or for a reuse of the carrier for another fabrication line or lines, or for a continuous use of the carrier for another group of electronic materials, or for a continuous use of the carrier for another processing step or steps, or for a continuous use of the carrier for another fabrication area or areas, or for a continuous use of the carrier for another fabrication line or lines.

2. The device of claim 1, wherein each indicator plate represents a single step in the processing of the materials in the carrier.

3. The device of claim 1, wherein each indicator plate represents a series of steps in the processing of the materials in the carrier.

4. The device of claim 1, wherein each indicator plate and cover plate are made of plastic.

5. The device of claim 1, wherein each indicator plate and cover are made of metal.

6. The device of claim 1, wherein each indicator plate has a different color in the colored area.

7. The device of claim 1, wherein each indicator plate represents a classification of the result after processing the materials in the carrier.

8. The device of claim 1, wherein each indicator plate represents classification for the processing of the materials in the carrier.

9. The device of claim 1, wherein each indicator plate represents designation of step or steps in processing the materials in the carrier.

10. The device of claim 1, wherein each indicator plate represents area in the fabrication of the materials in the carrier.

11. The device of claim 1, wherein each indicator plate represents line in the fabrication of the materials in the carrier.

12. The device of claim 1, wherein each indicator plate further represents a equipment in a line in fabricating the materials in the carrier.

13. The device of claim 1, wherein each indicator plate further represents a operator, operating a equipment in a line in fabricating the materials in the carrier.

14. The device of claim 1, wherein each indicator plate incorporates in the process automation, manufacturing automation, information automation, having the plurality in being sensed by the human eyes and being sensed by the mechanical devices.

15. The device of claim 1, wherein each indicator plate incorporates in frequent process change, or periodic process change, or quick process change, having the plurality in being sensed by the human eyes and being sensed by the mechanical devices.

* * * * *